United States Patent [19]

Mizumoto

[11] Patent Number: 5,053,720
[45] Date of Patent: Oct. 1, 1991

[54] POWER AMPLIFYING CIRCUIT

[75] Inventor: Toru Mizumoto, Hino, Japan

[73] Assignee: Kabushiki Kaisha Toshiba, Kawasaki, Japan

[21] Appl. No.: 553,628

[22] Filed: Jul. 18, 1990

[30] Foreign Application Priority Data

Jul. 19, 1989 [JP] Japan .................. 1-184810

[51] Int. Cl.[5] .............................................. H03F 3/04
[52] U.S. Cl. .................................... 330/296; 330/297
[58] Field of Search .............................. 330/127–129, 330/285, 296; 455/116, 127

[56] References Cited

FOREIGN PATENT DOCUMENTS 230226 10/1987 Japan .................................. 455/127

Primary Examiner—James B. Mullins
Attorney, Agent, or Firm—Oblon, Spivak, McClelland, Maier & Neustadt

[57] ABSTRACT

A power amplifying circuit comprises multi-stage amplifiers connected in cascade, a first switching circuit connected to the last stage amplifier, a second switching circuit connected to the amplifiers other than the last stage amplifier, and an output power adjusting circuit connected to the switching circuit, for controlling a bias voltage. The bias voltage of the last stage amplifier and the bias voltages of the other stage amplifiers are controlled separately from each other by the first and second switching circuits, respectively.

9 Claims, 2 Drawing Sheets

POWER AMPLIFYING CIRCUIT

BACKGROUND OF THE INVENTION

1. Field of the Invention

The present invention relates to a power amplifying circuit used for electronic apparatuses of a low power consumption type such as a mobile communication equipment.

2. Description of the Related Art

A conventional power amplifying circuit used in a low power consumption type electronic apparatus comprises multi-stage amplifiers connected in cascade to one another and an output power adjusting potentiometer for controlling the bias voltages of the amplifiers and a switching circuit.

In the conventional power amplifying circuit, when an input signal is supplied to a first stage amplifier, the input signal is amplified by this amplifier and then output through a coupling capacitor. The input signal output from the first stage amplifier is amplified in order by the second to last stage amplifiers and then supplied to, e.g., a transmission antenna. If the resistance of the potentiometer varies in order to adjust output power, both a power source voltage applied to a load circuit of each of the amplifiers and a bias voltage applied to each of bias circuits vary and thus the amplification factor of each amplifier varies, thereby causing the output voltage of the input signal to be changed.

The power source voltage of a power amplifying circuit of a low power consumption type is generally low. If the bias voltages of all amplifiers are changed by a potentiometer as in the above conventional power amplifying circuit, the base potential of a transistor is lowered in the first and second stage amplifiers and the collector current of the transistor is easily affected by the voltage between the base and emitter thereof. For this reason, in the conventional amplifying circuit, the output power is susceptible to variations in temperature and the temperature characteristics of the circuit are deteriorated.

SUMMARY OF THE INVENTION

It is accordingly an object of the present invention to provide a power amplifying circuit which lessens an influence of temperature variations on output power to improve temperature characteristics.

It is another object of the present invention to provide a power amplifying circuit which improves temperature characteristics and reduces unnecessary waves transmitted when power is on.

According to one aspect of the present invention, there is provided a power amplifying circuit comprising multi-stage amplifiers, first and second switching circuits, and an output power adjusting circuit for controlling bias voltages of the amplifiers, wherein a bias voltage of the last stage amplifier and bias voltages of the other stage amplifiers are controlled independently by the first and second switching circuits, and a bias voltage output from the output power adjusting circuit causes the first switching circuit to control a bias voltage of the last stage amplifier.

According to another aspect of the present invention, there is provided a power amplifying circuit comprising multi-stage amplifiers connected in cascade, first and second switching circuits, an output power adjusting circuit for controlling bias voltages of the amplifiers, and a delay circuit for causing operation start timing of the first switching circuit to differ from that of the second switching circuit, wherein a bias voltage of the last stage amplifier and bias voltages of the other stage amplifiers are controlled independently by the first and second switching circuits, a bias voltage output from the output power adjusting circuit causes the first switching circuit to control a bias voltage of the last stage amplifier, and the delay circuit delays the operation start timing of the first switching circuit in relation to that of the second switching circuit.

In the power amplifying circuit having the arrangement mentioned above, the bias voltage of the last stage amplifier and those of the other stage amplifiers are controlled independently of each other, and an output voltage is controlled by only the last stage amplifier. For this reason, the bias voltages of the amplifiers other than the last stage amplifier are not affected or changed by the adjustment of the output voltage and do not vary; therefore, they are kept somewhat high. Even though the power amplifying circuit is a circuit operated at a low voltage, the output voltage is not susceptible to temperature variations and the power amplifying circuit can thus have good temperature characteristics.

The first switching circuit for controlling the bias voltage of the last stage amplifier starts to operate later than the second switching circuit for controlling the bias voltages of the other stage amplifiers. Even though a great variation in frequency occurs in the amplifiers other than the last stage amplifier when they are started, a transmission wave including the frequency variation can be prevented from being transmitted as it is. Consequently, there is not much fear of undesirable influence of the transmission wave on any other radio sets.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Figure 1:
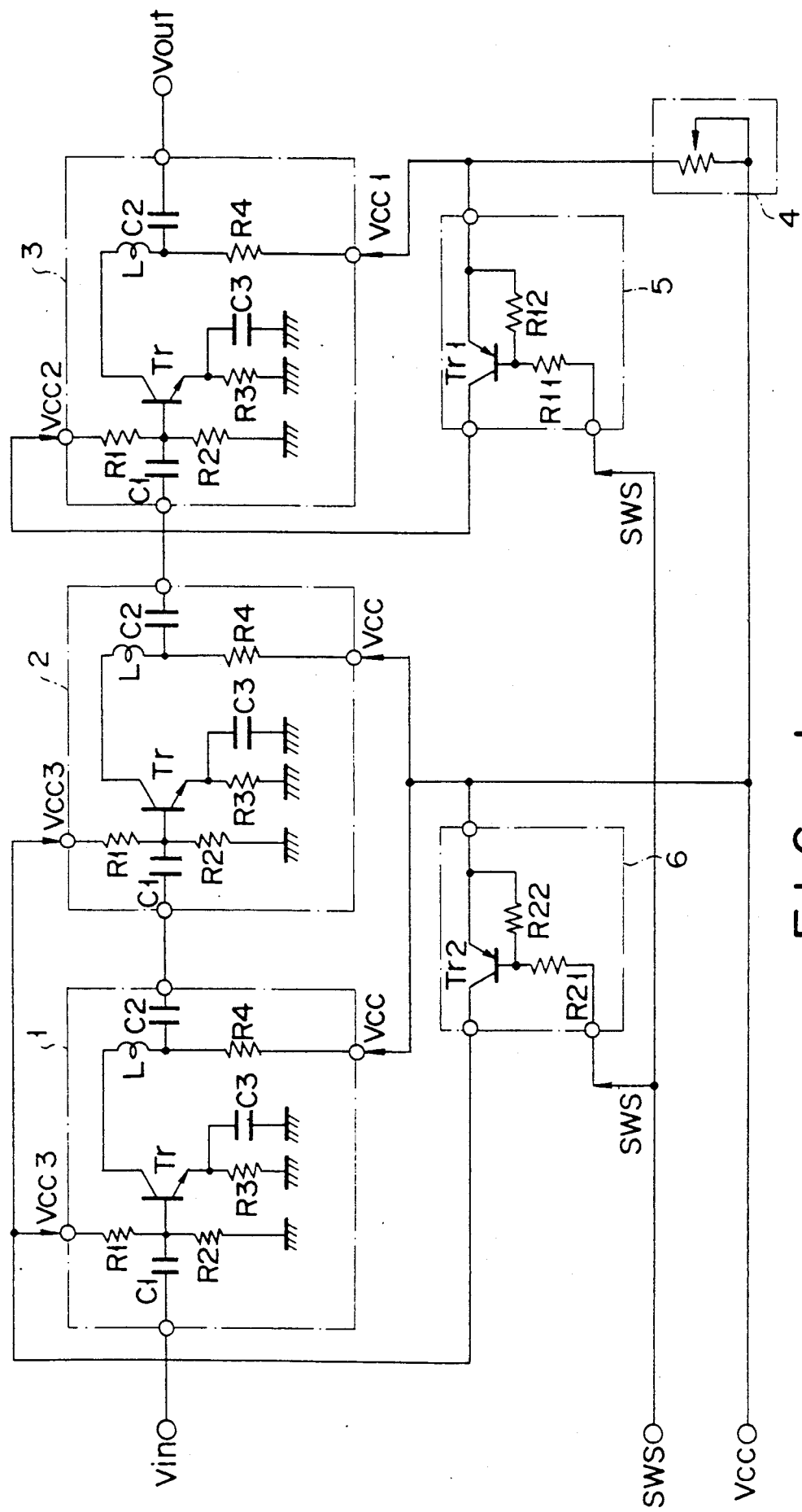
FIG. 1 is a circuit diagram showing a power amplifying circuit according to an embodiment of the present invention.

According to the first embodiment of the present invention, a power amplifying circuit comprises three stage amplifiers 1, 2 and 3 connected in cascade to one another, output voltage adjusting potentiometer 4 for controlling a bias voltage of the last stage amplifier 3, first switching circuit 6 connected to the first and second stage amplifiers 1 an 2, and switching circuit 5 connected to amplifier 3.

Each of amplifiers 1, 2 and 3 includes transistor Tr whose base is connected to a bias circuit constituted of resistors R1 and R2 and whose collector is connected to a load circuit constituted of inductor L and resistor R4. The emitter of transistor Tr is grounded through a parallel circuit constituted of emitter resistor R3 and bypass capacitor C3.

The collector of transistor Tr of amplifier 3 is connected to an input terminal to which power source voltage Vcc1 is applied, through potentiometer 4 and the load circuit (L, R4). The bias circuit (R1) of amplifier 3 is connected to an input terminal to which bias voltage Vcc2 output from first switching circuit 5 is applied. First switching circuit 5 comprises switching transistor Tr1, resistor R12 connected between the base and emitter of switching transistor Tr1, and resistor R11 connected to the base of switching transistor Tr1. The base of switching transistor Tr1 is supplied with switching pulse SWS output from an oscillator (not shown) through resistor R11. Similarly, second switching circuit 6 comprises switching transistor Tr2, resistor R22 connected between the base and emitter of switching transistor Tr2, and resistor R21 connected to the base of switching transistor Tr2. The base of switching transistor Tr2 is supplied with switching pulse SWS output from an oscillator (not shown) through resistor R21.

First switching circuit 5 is arranged to apply bias voltage Vcc2 to only amplifier 3 on the last stage, and bias voltage Vcc2 is generated from power source voltage Vcc1 passing through output adjusting potentiometer 4. Second switching circuit 6 is arranged to apply bias voltage Vcc3 to amplifiers 2 and 3 on the first and second stages other than amplifier 3 on the last stage, and bias voltage Vcc3 is generated from power source voltage (Vcc). Power source voltage Vcc1, which is generated by the passing of power source voltage Vcc through potentiometer 4, is applied to amplifier 3, and power source voltage Vcc is applied to amplifiers 1 and 2 as it is.

In the power amplifying circuit so arranged, when input signal Vin is supplied to the first stage amplifier 1, it is amplified by amplifier 1 and then output via coupling capacitor C1. Input signal Vin output from amplifier 1 is amplified in sequence by the second and last stage amplifiers 2 and 3 and supplied to, for example, a transmission antenna (not shown). If the resistance of potentiometer 4 then changes in order to adjust output power, power source voltage Vcc1 applied to the load circuit of amplifier 3 changes, resulting in a change in the amplification factor of amplifier 3 and thus in the output power of input signal Vin.

When switching pulses SWS start to be supplied to first and second switching circuits 5 and 6, switching circuit 5 produces bias voltage Vcc2 according to power source voltage Vcc1 adjusted by potentiometer 4, and bias voltage Vcc2 is applied to the last stage amplifier 3. Input signal Vin is therefore amplified by amplifier 3 in accordance with bias voltage Vcc2 set by potentiometer 4.

On the other hand, switching circuit 6 produces bias voltage Vcc3 according to power source voltage Vcc, and bias voltage Vcc3 is then applied to the bias circuits of amplifiers 1 and 2. Input signal Vin is thus amplified by amplifiers 1 and 2 in accordance with bias voltage Vcc3. In other words, in amplifiers 1 and 2, the base potential is always kept higher than a predetermined value since the adjustment of potentiometer 4 prevents the bias voltage from decreasing; accordingly, the amplifying operation is performed so that the collector current of transistor Tr is not adversely affected by voltage $V_{BE}$ between the base and emitter. The influence of the temperature variations on the output power is reduced and thus the degradation of the temperature characteristics of the circuit can be suppressed.

A power amplifying circuit according to another embodiment of the present invention will be described with reference to FIG. 2. This embodiment has substantially the same circuit arrangement as that of the embodiment shown in FIG. 1. In the circuit shown in FIG. 2, however, delay circuit 7 is provided at a pulse supply path for supplying switching pulse SWS to first switching circuit 5. Delay circuit 7 delays the start timing at which switching pulse SWS is supplied to first switching circuit 5 by a predetermined time interval with respect to the start timing at which switching pulse SWS is supplied to second switching circuit 6.

Figure 2:
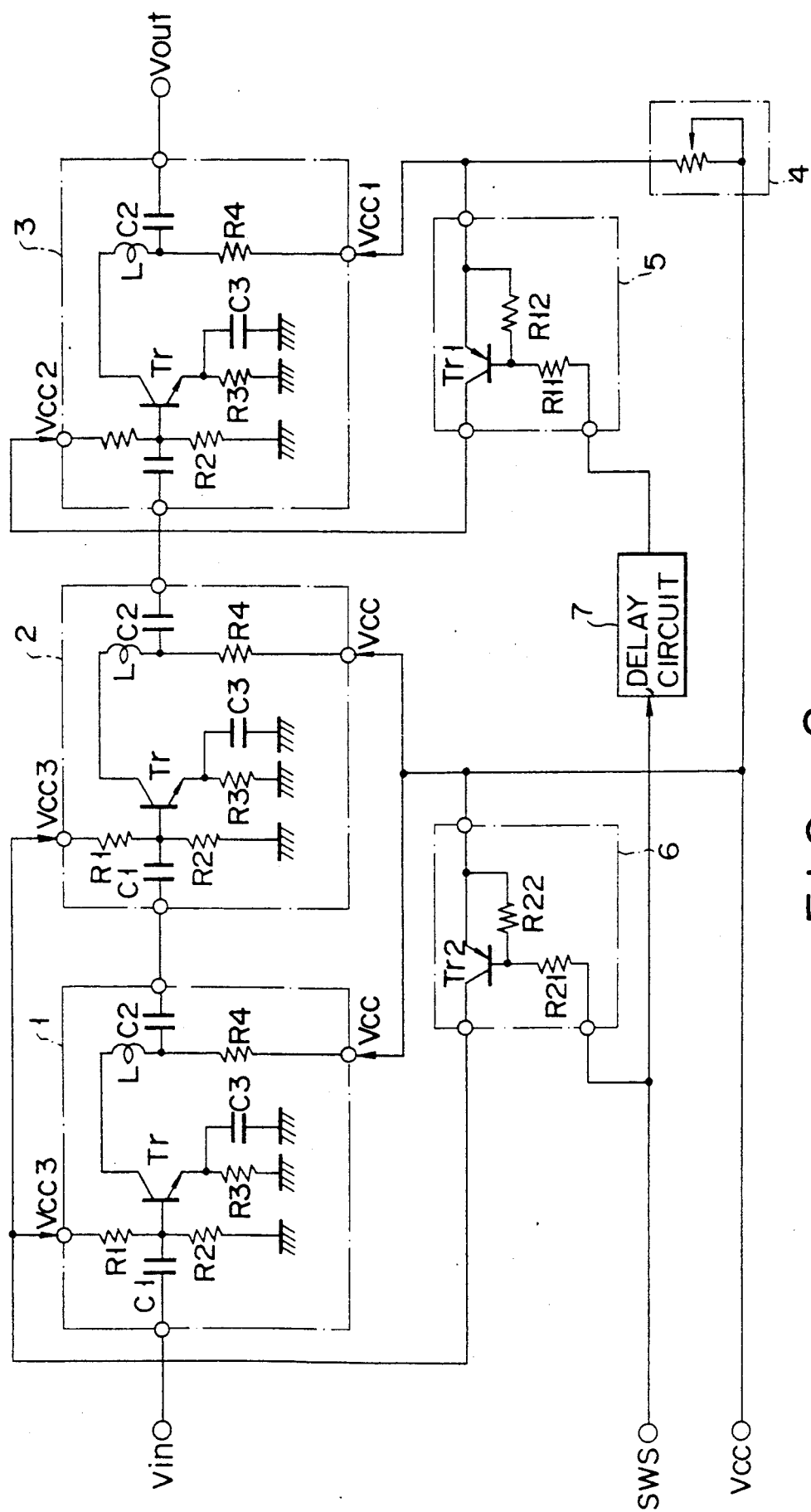
FIG. 2 is a circuit diagram showing a power amplifying circuit according to another embodiment of the present invention.

According to the embodiment shown in FIG. 2, when the supply of switching pulse SWS starts, pulse SWS is supplied to second switching circuit 6 immediately, and it is supplied to first switching circuit 5 with a delay of a predetermined time interval. For this reason, the last stage amplifier 3 starts its amplifying operation after the first and second stage amplifiers 1 and 2 are stabilized after a lapse of rise time of amplifiers 1 and 2. Even though an unstable signal whose frequency greatly varies is output from amplifiers 1 and 2 during the rise time, the unstable signal is not transmitted as it is through amplifier 3. The power amplifying circuit shown in FIG. 2 prevents unnecessary waves from being transmitted to eliminate an adverse influence upon communications with other communication equipments.

The present invention is not limited to the above embodiments. Though three stages amplifiers are used in the above embodiments, two stage amplifiers or four or more stage amplifiers can be used in this invention. In the embodiments, the bias voltage is controlled by potentiometer 4 with respect to only last stage amplifier 3. When plurality of stage amplifiers are used, however, a bias voltage can be controlled with respect to the two or more stage amplifiers including the last stage amplifier.

What is claimed is:

1. A power amplifying circuit comprising:
multi-stage amplifiers including a last stage amplifier, said amplifiers being connected in cascade;
first switching means connected to at least the last stage amplifier, for controlling a bias voltage thereof;
second switching means connected to the amplifiers other than said last stage amplifier, for controlling bias voltages thereof;
voltage applying means for applying a first power source voltage to the amplifiers other than said last stage amplifier; and
output power adjusting means connected to said last stage amplifier and said first switching means, for controlling a second power source voltage applied to said last stage amplifier and said first switching means.

2. A power amplifying circuit according to claim 1, wherein said output power adjusting means comprises voltage adjusting means for converting the first power source voltage to the second power source voltage.

3. A power amplifying circuit according to claim 2, wherein said voltage adjusting means comprises a potentiometer.

4. A power amplifying circuit according to claim 1, wherein said first switching means comprises a first switching element whose switching operation is controlled by a switching pulse and which applies the second power source voltage output from said output power adjusting means to said last stage amplifier as a bias voltage, and said second switching means comprises a second switching element whose switching operation is controlled by a switching pulse and which applies the first power source voltage to the amplifiers other than the last stage amplifier as a bias voltage.

5. A power amplifying circuit according to claim 4, wherein said circuit comprises delay means connected to said first switching means, for delaying said switching pulse by a predetermined time interval and supplying a delay pulse for controlling the switching operation of said first switching element to said first switching means.

6. A power amplifying circuit comprising:
   a multi-stage amplifiers including a last stage amplifier, said amplifiers being connected in cascade;
   first switching means for controlling a bias voltage of at least said last stage amplifier;
   second switching means for controlling bias voltages of the amplifiers other than said last stage amplifier;
   output power adjusting means for controlling a power source voltage applied to said last stage amplifier and said first switching means; and
   control means for controlling said first and second switching means so that said first switching means is activated after said second switching means.

7. A power amplifying circuit according to claim 6, wherein said output power adjusting means comprises voltage adjusting means for receiving a main power source voltage and converting the main power source voltage into the power source voltage.

8. A power amplifying circuit according to claim 7, wherein said voltage adjusting means comprises a potentiometer.

9. A power amplifying circuit according to claim 7, wherein said first switching means comprises a first switching element whose switching operation is controlled by a switching pulse and which applies the power source voltage output from said output power adjusting means to said last stage amplifier as a bias voltage, and said second switching means comprises a second switching element whose switching operation is controlled by a switching pulse and which applies the main power source voltage to the amplifiers other than said last stage amplifier as a bias voltage.

* * * * *